United States Patent [19]
Moynihan et al.

[11] Patent Number: 5,640,184
[45] Date of Patent: Jun. 17, 1997

[54] ORIFICE PLATE FOR SIMPLIFIED INK JET HEAD

[75] Inventors: Edward R. Moynihan, Lebanon; David W. Gailus, Merrimack; Robert G. Palifka, Orford, all of N.H.; Paul A. Hoisington, Norwich; Nathan P. Hine, South Strafford, both of Vt.; David Adams-Brady, Meriden, N.H.; Melvin L. Biggs, Norwich, Vt.; Marlene M. McDonald, Enfield; Steven H. Barss, Wilmot Flat, both of N.H.; Diane Mackay, Corinth, Vt.; Bruce A. Paulson, Newport, N.H.; Stephen C. Mackay, Corinth, Vt.

[73] Assignee: Spectra, Inc., Hanover, N.H.

[21] Appl. No.: 458,738

[22] Filed: Jun. 2, 1995

Related U.S. Application Data

[60] Division of Ser. No. 406,297, Mar. 17, 1995, which is a continuation-in-part of Ser. No. 215,301, Mar. 21, 1994.

[51] Int. Cl.[6] .......................................... B41J 2/14
[52] U.S. Cl. .............................................. 347/47
[58] Field of Search ........................ 347/47; 156/644.1; 205/69, 75; 239/601; 222/566, 574; 29/890.142

[56] References Cited

U.S. PATENT DOCUMENTS

| | | | |
|---|---|---|---|
| 4,184,925 | 1/1980 | Kenworthy | 347/47 X |
| 4,209,794 | 6/1980 | Kattner | 347/47 |
| 4,422,082 | 12/1983 | Louzil | 347/47 |
| 4,954,225 | 9/1990 | Bakewell | 347/47 X |
| 5,087,930 | 2/1992 | Roy et al. | 347/71 |

FOREIGN PATENT DOCUMENTS

| | | | |
|---|---|---|---|
| 4-257449 | 9/1992 | Japan | B41J 2/135 |

*Primary Examiner*—Joseph W. Hartary
*Attorney, Agent, or Firm*—Brumbaugh, Graves, Donohue & Raymond

[57] ABSTRACT

In the embodiments of the simplified ink jet head described in the specification an orifice plate has specially profiled orifice openings to assure axial projection of drops when ink is supplied from an asymmetric ink path leading to the orifice. For this purpose the orifice includes cylindrical ink inlet and outlet portions with the ink outlet portion having a smaller diameter and a shorter length than the inlet portion and a tapered conical portion joining the ink inlet portion and the ink outlet portion. Preferably, the diameter of the inlet portion is no more than about twice the diameter of the outlet portion.

2 Claims, 11 Drawing Sheets

ORIFICE PLATE FOR SIMPLIFIED INK JET HEAD

REFERENCE TO RELATED APPLICATION

This application is a division of the Moynihan et al. Application Ser. No. 08/406,297 filed Mar. 17, 1995, which is a continuation-in-part of the co-pending Moynihan et al. Application Ser. No. 08/215,301 filed Mar. 21, 1994 for SIMPLIFIED INK JET HEAD.

BACKGROUND OF THE INVENTION invention relates to ink jet head arrangements and, more particularly, to a new and improved ink jet head arrangement having a simple and inexpensive structure.

Conventional ink jet heads, in which ink received from an ink reservoir is ejected selectively through a series of orifices, have been made using thin plates of metal or ceramic material having appropriate passages which are bonded together in adjacent relation in an assembly, as described, for example, in the Roy et al. U.S. Pat. No. 5,087,930 and the Hoisington et al. U.S. Pat. No. 4,835,554. In such arrangements, each chamber or passage in the flowpath leading from the ink inlet to the orifice, through which the ink is ultimately ejected, is provided in one or more of the several plates in the assembly. This requires an array of plates having different thicknesses, each of which must be separately machined to precise dimensions to produce the appropriate chambers and passages, and also requires precise positioning of all of the chambers and passages in the plates. Moreover, the plates must be assembled and bonded together and to a piezoelectric plate in highly precise alignment, and each plate must be flat and free from burrs that would cause voids between adjacent plates. Furthermore, because of differences in the coefficients of thermal expansion between the materials used in the plates, bond stresses are generated by temperature variations which occur in connection with the manufacture and use of the ink jet head which must be overcome.

In hot melt ink jet printheads, which operate at elevated temperatures, the printhead materials must be good conductors of heat so that the printhead will warm up quickly and the temperature gradients during operation will be small. The stresses created when parts of different materials expand differently with changes in temperature is another concern. The prime mover in a printhead is usually a piezoelectric ceramic (PZT) which has a relatively low thermal expansion coefficient. For optimum printhead design, the challenge is to find other materials which are close to this expansion. If the printhead materials cannot be matched, it is desirable to have low-modulus materials to reduce the stresses.

The ink passages in an ink jet printhead are fine features with tight tolerances. To maintain such tight tolerances, the manufacture of the printhead requires low machining forces, small tool deflection and small machining errors, no plastic deformation and no burrs. Moreover, it may be desirable, particularly in development, that the manufacture should be carried out using standard machining methods, such as grinding, milling, drilling and shaping.

In addition, the printhead should be made of materials which are chemically inert and do not change shape over time when loaded or oxidize or interact with organic chemicals found in hot-melt and other inks or with pigments or dyes in the inks.

Heretofore, some plates used in ink jet heads have been photo-etched to provide the appropriate chambers and passages, which has the advantage that the plates are generally burr-free and can be made from Kovar material, stainless steel and other materials that have appropriate mechanical and thermal expansion characteristics. The materials useful for photo-etching, however, have drawbacks when used in connection with ink jet heads from which hot melt ink is ejected since they generally have low thermal conductivity. In addition, the photo-etching process has the disadvantage of being a batch process with lot-to-lot variations and, moreover, when used in this manner, produces a relatively large quantity of chemical waste.

Furthermore, conventional piezoelectric plates used in ink jet heads are thin, fragile and susceptible to damage during processing. Because of the greater likelihood of damage to larger plates, the maximum size of piezoelectric plates is normally quite small, for example, less than about 100 mm, which correspondingly limits the length of an array of orifices through which ink is ejected as a result of the actuation of the piezoelectric plate.

SUMMARY OF THE INVENTION

Accordingly, it is an object of the present invention to provide an ink jet head which overcomes the disadvantages of the prior art.

Another object of the invention is to provide an ink jet head having a simple structure which is inexpensive to develop, is convenient to manufacture and is capable of providing high resolution ink jet printing.

These and other objects and advantages of the invention are attained by providing an ink jet head having at least one or more components formed from a carbon member. A preferred carbon component is one in which ink pressure chambers and connecting passages from ink supply lines and to ink jet orifices are formed. In one embodiment, a carbon component is a plate having pressure chambers formed on one side and flow-through passages to permit continuous ink circulation through the pressure chambers formed on the other side of the plate with connecting passages leading to an orifice plate and to an ink supply extending through the carbon plate. In addition, an orifice plate is affixed to one side of the carbon plate with the orifices aligned with orifice passages in the carbon plate and a piezoelectric plate is affixed to the other side of the carbon plate with actuating electrodes aligned with the pressure chambers to cause the piezoelectric material to be deflected so as to apply pressure to the corresponding pressure chamber and eject a drop of ink through a corresponding orifice in the orifice plate.

In another embodiment, a carbon pressure chamber plate is formed on opposite sides with linear arrays of pressure chambers having ink inlet and outlet passages at opposite ends. Both sides of the carbon plate are covered by corresponding piezoelectric actuation plates and a plurality of such carbon pressure chamber plates are retained in laterally adjacent relation in a carbon collar member with the ink outlet passages therein positioned in alignment with corresponding ink passages extending through a carbon manifold plate. A manifold plate has one side retained against the ends of the plurality of pressure chamber plates and has lateral ink passages formed in the opposite side leading to a line of orifices in an orifice plate mounted on the opposite side.

In accordance with one aspect of the invention, the carbon pressure chamber plate has an ink deaeration passage through which ink is supplied to the inlet passages leading to the pressure chambers and an internally supported, thin-walled tubular member made of air-permeable, ink-impermeable material connected at one end to a source of reduced pressure is inserted into the ink deaeration passage to provide a unitary ink deareating and pressure chamber carbon plate. This arrangement accomplishes the necessary deaeration of ink immediately before it is supplied to the pressure chambers with minimal space requirements and without necessitating recirculation of ink to an ink reservoir.

In connection with the assembly of carbon plate components of the above type in an ink jet head, it has been learned surprisingly that it is not necessary to cement or otherwise physically bond together carbon plate components having communicating a passages or to provide a gasket between them. Because the engaging surfaces of such carbon plate components can be made very smooth and flat and carbon plates are sufficiently rigid to avoid flexing, such places can be mechanically fastened together by screws or the like without causing ink to flow between the components and, if desired, a filter layer may be interposed between the surfaces of such fastened components.

Because the carbon body can be machined precisely without causing burrs using conventional machining techniques and, since carbon has a low thermal coefficient of expansion, dimensional variations resulting from thermal expansion during machining are minimized on the plate. In addition, the carbon expansion coefficient is especially compatible with the piezoelectric plate which is affixed to it, thereby reducing or eliminating stresses between the plates which might otherwise be produced by temperature variations such as occur when the ink jet head is used with hot melt ink. Moreover, carbon is chemically inert with respect to materials in which it comes in contact in an ink jet head. It does not oxidize nor does it interact with organic chemicals found in hot-melt and other inks or with pigments or dyes used in inks.

According to another aspect of the invention, the piezoelectric plate has actuating electrodes on only one side of the plate and is prepared by a photo-etching technique in which a piezoelectric plate coated on one side with electrode material is affixed to the pressure chamber side of the carbon plate with the electrode material-coated side exposed. The exposed side of the plate is coated with a photoresist material and is then exposed to a desired electrode pattern in precise alignment with the pressure chamber pattern in the carbon plate, after which the photoresist is developed, the exposed electrode material is etched away, and the remaining photoresist is removed to produce an electrode pattern conforming exactly in shape and position to the pattern of pressure chambers in the carbon plate. In addition, the electrode pattern thus formed on the piezoelectric plate can include other electrical elements such as a heater to heat ink in the passages in the carbon plate.

In accordance with a further aspect of the invention, the carbon plate is porous, preferably being about 80-90% dense, and the porosity and a vacuum source communicating with the surface of the plate can extract dissolved air from ink in the ink passages separated from the porous carbon material by an air-permeable, ink-impermeable layer.

If desired, a page-size carbon plate can be prepared with a row of separate piezoelectric plates affixed to one side of the plate. Moreover, the carbon plate may have orifice passages formed in an edge of the plate rather than in one of the sides of the plate.

Since engineering grade carbon is friable, i.e., microscopic grains are readily broken away from a carbon body, it is easily shaped without producing burrs. As described in "Graphite Machinery Made Easy", *EDM Today*, Sept./Oct. 1993 pp. 24ff, the relative softness and lack of ductibility of such carbon allows it to be cut at high feed rates with little distortion and low tool wear. These characteristics permit carbon blocks to be readily formed into components of ink jet heads by conventional or unique machining techniques.

In one example, the formation of an array of closely adjacent pressure chambers for an ink jet head which have a long aspect ratio and require highly precise and uniform channel dimensions, would require prohibitively long machine cycle times using a conventional end mill. In accordance with another aspect of the invention, however, the process for manufacturing a carbon plate component of an ink jet head is greatly simplified by shaping the carbon plate using a series of linear motions against the surface of the carbon plate with a shaping tool having the desired profile. For the pressure chambers of a carbon pressure plate, for example, a tool having a series of closely spaced short teeth is scraped across the surface in several strokes to produce a series of precise channels of the required dimensions. To make a row of small diameter holes of substantial depth in one end of a body, two carbon plates may be shaped in a similar way with matching arrays of grooves having a depth equal to half the diameter of the desired holes and then cemented together with the grooves in alignment. Using certain tool shapes the holes may have a hexagonal shape rather than a circular shape.

Other machining techniques especially useful in shaping carbon bodies are electric discharge machining, which facilitates convenient formation of complex shapes, and laser machining, which can be used effectively for through holes and slots.

According to still another aspect of the invention, improved directionality of ink drop ejection from orifices supplied from nonaxial orifice passages is achieved by providing orifice plate orifices having cylindrical outlet nozzle passages, larger diameter cylindrical inlet passages, and a conical intermediate section joining the outlet and inlet passages.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
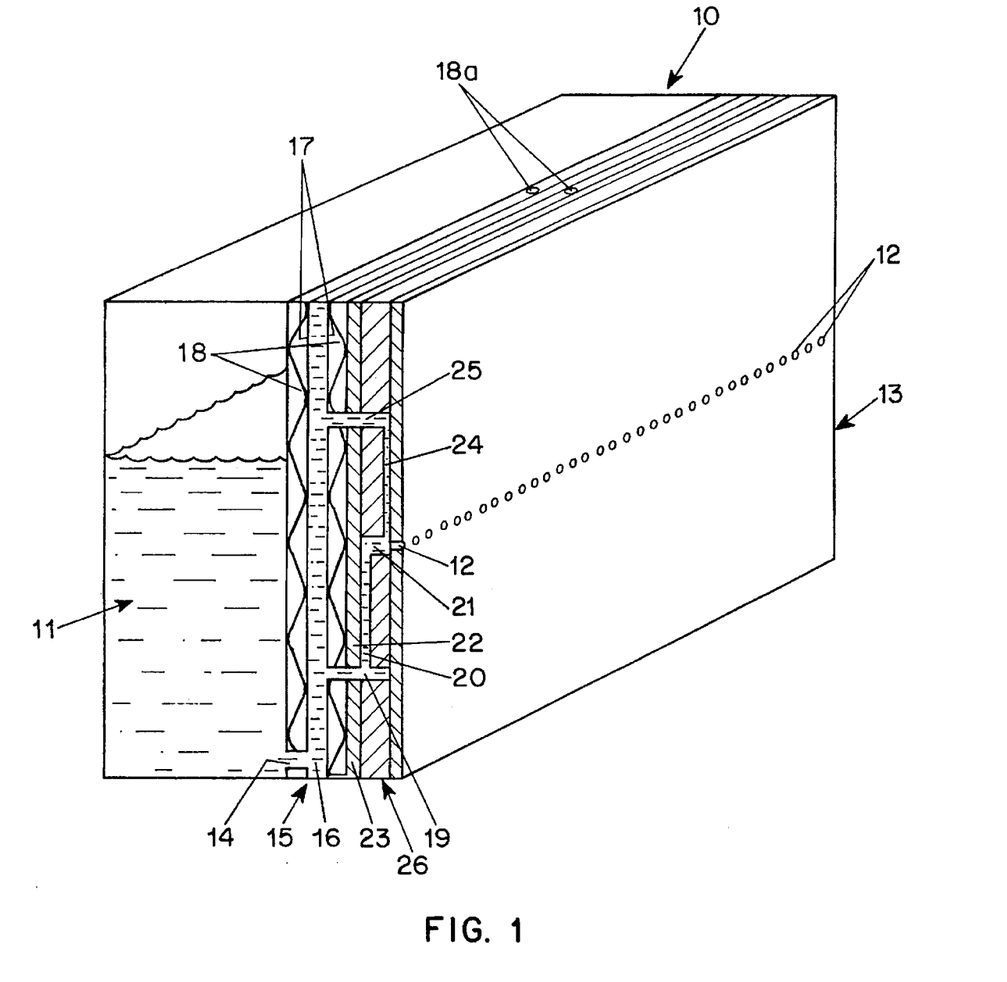
FIG. 1 is a schematic perspective sectional view illustrating a representative embodiment of a simplified ink jet head arranged in accordance with the invention.

In the typical embodiment of the invention schematically shown in FIG. 1, an ink jet head 10 includes a reservoir 11 on one side containing ink which is to be selectively ejected in the form of drops through an array of orifices 12 formed in an orifice plate 13 mounted on the opposite side of the head. Ink from the reservoir 11 is supplied through a passage 14 to a deaerator 15 in which an ink path 16 extends between air-permeable, ink-impermeable membranes 17, each of which is backed by a vacuum plenum 18 connected through ports a to a remote vacuum source (not shown) to extract dissolved air from the ink. Deaerated ink from the passage 16 is conveyed through a passage 19 to a pressure chamber 20 from which it is ejected on demand through an orifice passageway 21 and a corresponding orifice 12 in the orifice plate 13 in response to selective actuation of the adjacent portion 22 of a piezoelectric plate 23.

The general arrangement of the ink jet head 10 and the deaerator 15 is of the type described, for example, in the Hine et al. U.S. Pat. No. 4,937,598, the disclosure of which is incorporated herein by reference. The ink in the reservoir 11 may, if desired, be hot melt ink which is solid at room temperature and liquid at elevated temperatures, in which case heaters (not shown) are mounted at appropriate locations in the ink jet head 10.

In order to permit the ink supplied to the orifices to be deaerated continuously even though ink is not being ejected through the orifices 12, the head includes a flow-through passage 24 extending from each orifice passage 21 to a return passage 25 leading back to the deaeration path 16 in the deaerator 15, and a continuous slow circulation of ink through the duct 19, the chamber 20, the orifice passage 21, the flow-through passage 24 and the duct 25 back to the deaerator passage 16 is maintained by thermal convection, as described, for example, in the Hine et al. U.S. Pat. No. 4,940,995 issued Jul. 10, 1990, the disclosure of which is incorporated herein by reference. For this purpose, a heater (not shown in FIG. 1) is arranged to heat the ink near the lower end of the flowpaths consisting of the passages 19, 20, 21, 24 and 25 above its normal temperature to cause a convective flow of the ink through those passages, thereby conveying the ink back to the deaerator 16.

In accordance with the invention, the passages 19, 20, 21, 24 and 25 are formed in a plate 26 made of engineering carbon graphite, which is preferably about 80–90% dense, providing a slightly porous plate structure. The carbon plate 26 is machined by micromachining techniques from opposite sides to produce the chambers and passages required for the ink jet head. The carbon plate can be machined by milling, drilling, broaching, grinding and the like, using conventional tools providing high material removal rates with minimum tool wear, to produce openings with much closer tolerances than the conventional metal plates of the type described, for example, in the Hoisington et al. Pat. No. 4,835,554. Because the carbon material is friable, no burrs are produced during machining. Moreover, the coefficient of thermal expansion of the carbon graphite body is substantially the same as that of the ceramic piezoelectric material of which the piezoelectric plate 23 is made so as to reduce or substantially eliminate thermal stresses which occur between those components of the head as a result of variations in temperature.

The preferred carbon material for use in forming components on ink jet heads is polycrystalline graphite, which is a mixture of small crystals of graphite sintered with amorphous carbon (lamp black). This produces an amorphous matrix of small (0.025–5μ) grains and smaller (0.005–0.2μ) pores. This material, which is different from powdered graphite and carbon fiber materials, offers many benefits, including good thermal conductivity, coefficient of thermal expansion close to ceramic piezoelectric materials, good machinability, dimensional stability and chemical inertness.

The thermal properties of polycrystalline graphite (Grade DFP-1 available from POCO Graphite, Inc., Decatur, Tex.) and other materials which might be considered for printheads are compared with those of lead zinc titanate (PZT) ceramic piezoelectric material in Table 1 below:

TABLE 1

| Material | Conductivity (W/CmK) | Thermal Expansion (μ/m/degC.) | Modulus (×$10^5$ kg/cm_) |
|---|---|---|---|
| PZT | .015 | 2 to 4 | 7 |
| Thermoplastic (Ultem) | 0.0022 | 56 | 0.15 |
| Aluminum (6000) | 1.7 | 23.4 | 7 |
| Carbon (DFP-1) | .75 | 8.4 | 1.1 |

The Ultem (as well as other thermoplastics) has both poor conductivity and a very high thermal expansion coefficient. The conductivity of aluminum is attractive, but its high thermal expansion and modulus are problems. Polycrystalline carbon offers a good combination of all three properties.

Figure 10:
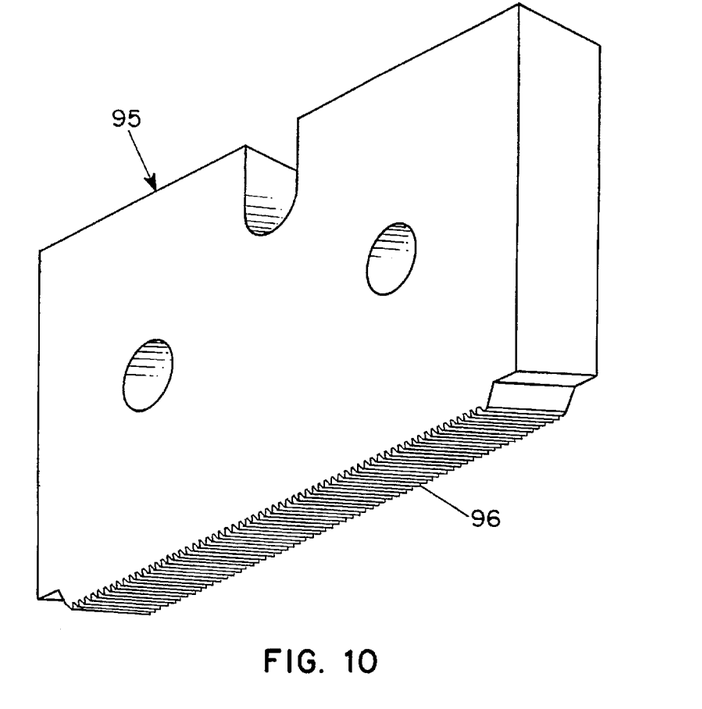
FIG. 10 is a perspective view showing a typical shaping tool for shaping arrays of ink passages in a carbon body for use in an ink jet head.

A potentially prohibitive aspect of the use of carbon members for ink jet components is the forming of closely spaced arrays of pressure chambers and other multitudinous, long aspect ratio, channels with precise dimensions. Using an end mill for these features could be expected to result in excessively long machine cycle times. To overcome this problem, a desired array of adjacent channel profiles is shaped in the surface of a carbon body by a specially formed tool 95, shown in FIG. 10, in a series of repeated linear motions or "scrapes." In the tool 95 for example, an array of 64 short uniformly spaced teeth 96 may be provided at one end of the tool to cut 64 parallel pressure chambers in the surface of a carbon plate. If the tool cuts at 0.025 mm per scrape, a depth of 0.15 mm can be achieved in 6 scrapes, which requires only a few seconds of machine time. The tool 95 makes an array of channels equal to the width of the tool, and can make a wider array by taking repeat adjacent passes. Tool irregularities are averaged out by taking finish cuts in the reverse direction or at a one-tooth offset. Reversing the tool also allows the formation of steeper channel ends when this is required. This technique can be used to make pumping chambers, manifold passages, flow-through passages, and the like. Finally, channels of variable or tapered depth can be made as well, by raising or lowering the tool as a cut is being made.

For an array of closely spaced deep, small diameter holes in a carbon body, where the depth is more than 3 times the drill diameter, drilling can become difficult and expensive. To provide an array of closely spaced holes having a diameter of, for example, 0.28 mm through a carbon plate 1.75 mm thick would require a great deal of time and a number of expensive drills. To form such an array in a simple manner, matching arrays of channels (which may be semi-hexagonal in shape) 0.14 mm deep are formed in two matching blocks of carbon which are then bonded together with adhesive to form a single block containing an array of parallel, long 0.28 mm diameter holes. This block is then sliced perpendicularly to the axes of the holes and ground flat to form the array bodies. The adhesive joint down the middle of the array body has been found to be very strong.

Polycrystalline carbon is easily bonded by a variety of adhesives. Three systems are particularly compatible with carbon in hot melt ink jet head applications. The first is a simple dispensed epoxy which works well for coarse scale joints. The second is a thermoplastic sheet adhesive. Using this technique, a thin teflon (TFE) sheet compressed at elevated temperature and pressure provides a tenacious bond between flat surfaces of polycrystalline carbon. Similarly, acrylic sheet adhesives should perform well at lower temperature. In the third technique, a dilute sprayed B-stage epoxy system is applied to the surfaces to be bonded. This has been shown to be adaptable to the complex geometries of ink jet printheads, yet high in strength at elevated temperatures.

There is some challenge in bonding a porous material like carbon with a spray application technique. Since excess adhesive will clog small passages, and thin layers may be drawn by capillary forces into the carbon body pores, careful control of process variables is required. In particular, the carbon pore structure must be uniform, the spray-deposited layer thickness must be small compared to the particle/pore size, and the heat cure process must be tuned to the adhesive rheology.

Figure 2:
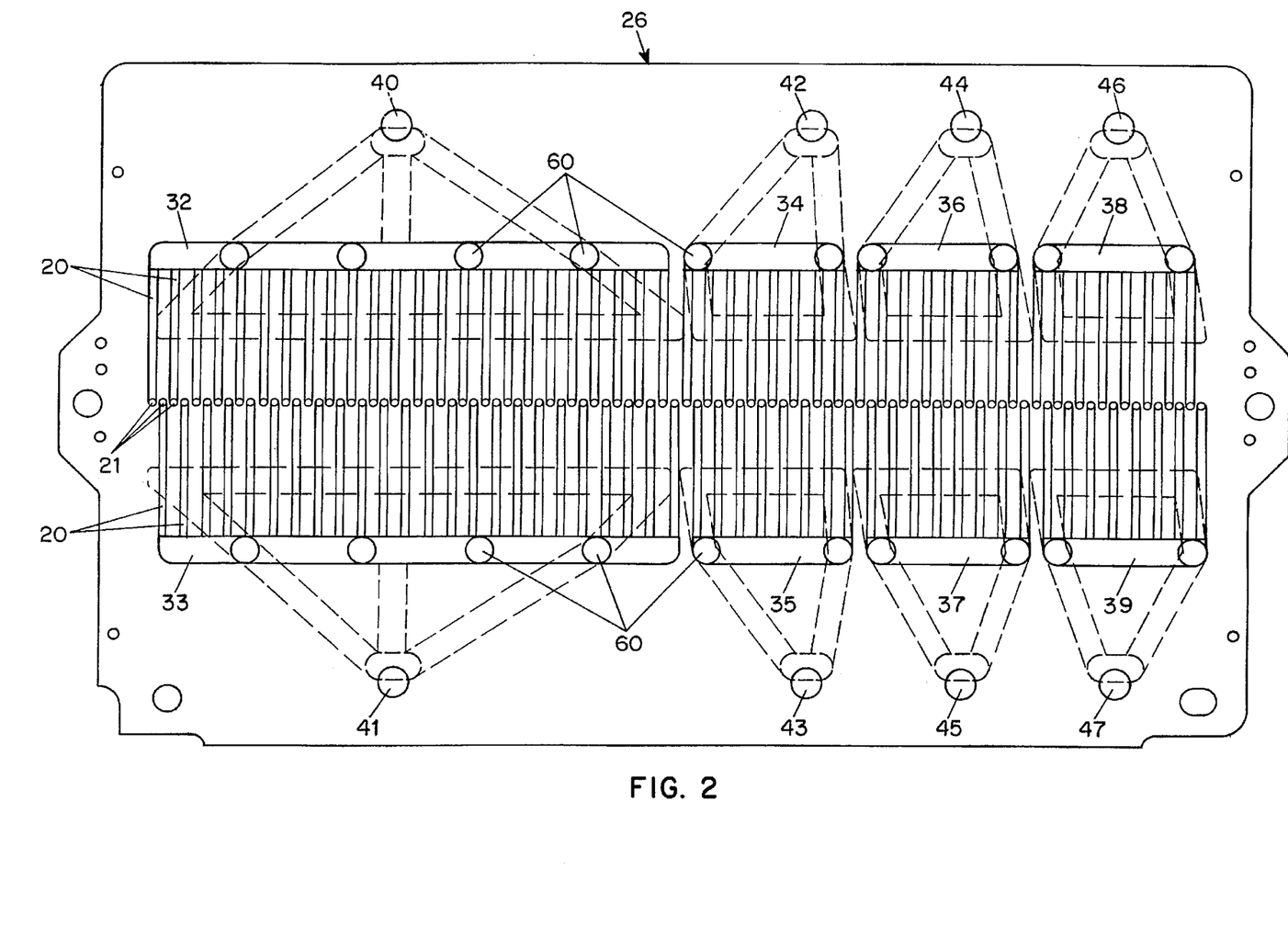
FIG. 2 is a plan view showing the pressure chamber side of a typical carbon plate for a multicolor ink jet head showing the arrangement of the pressure chambers and the related ink passages formed in the carbon plate.
Figure 3:
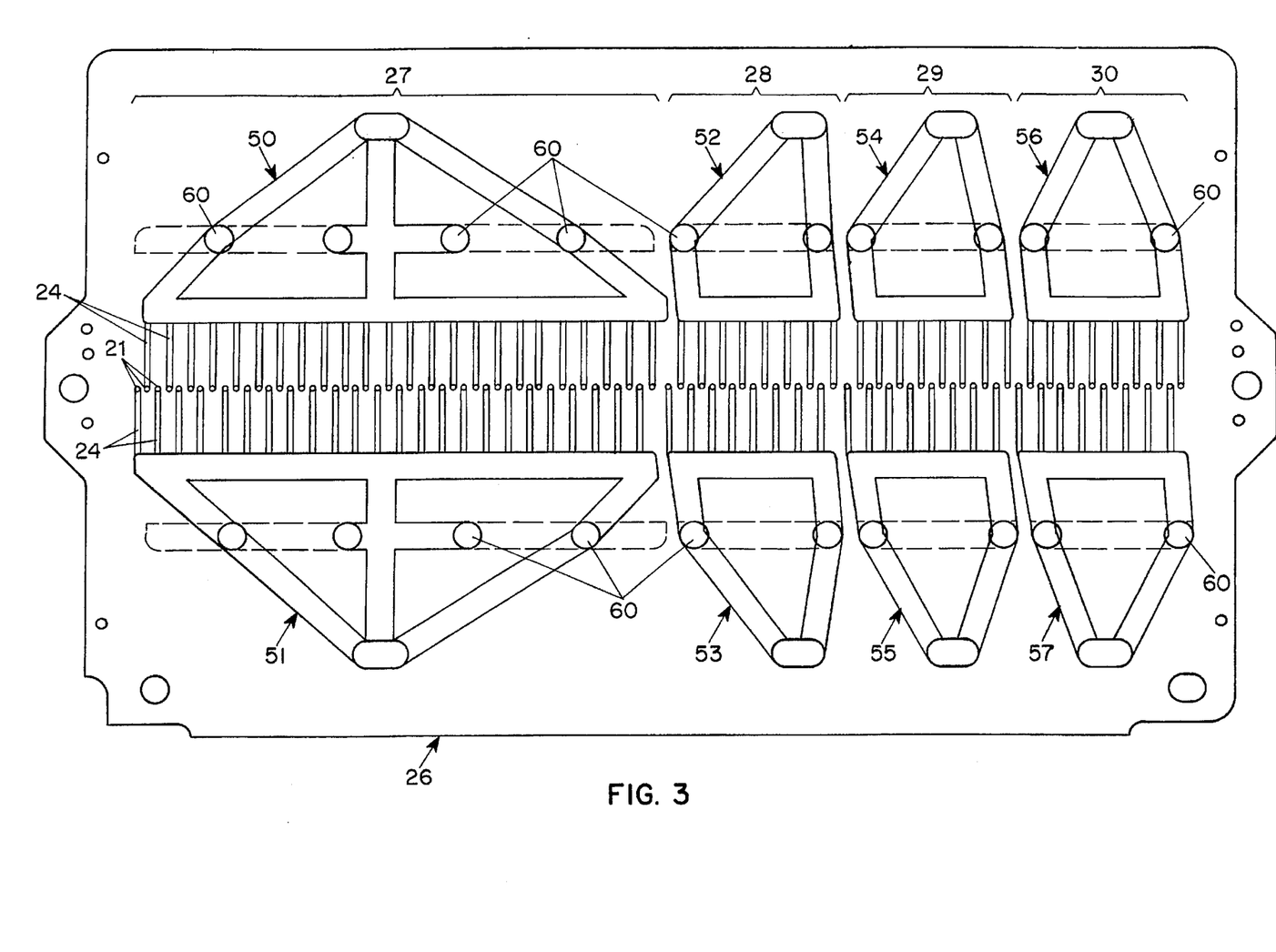
FIG. 3 is a view of the carbon plate of FIG. 2 from the same side shown in FIG. 2, but illustrating the passages formed in the opposite side of the carbon plate.

FIG. 2 illustrates a representative arrangement of pressure chambers 20 and orifice passages 21 as viewed from the piezoelectric plate side of the typical carbon monolithic plate 26 of FIG. 1, while FIG. 3 illustrates the other ends of the orifice passages 21 and the flow-through passages 24 which are formed in the opposite side of the monolithic array 26. FIG. 3, while showing the passages on the side of the monolithic array 26 which face the orifice plate 13, is illustrated with the passages seen as they would be viewed in the same direction as FIG. 2.

FIGS. 2 and 3 show supply passages for supplying four different color inks, e.g., black, yellow, magenta and cyan, to four different groups 27, 28, 29 and 30 of the orifice passages 21. Since black ink is normally used to a much greater extent than the colored inks, half of the orifice passages 21 are arranged to supply black ink, and one-third of each of the remaining passages are arranged to supply each of the colored inks.

As illustrated in FIG. 2, the pressure chambers 20 of the array are alternately disposed on opposite sides of the line of orifice passages 21 and are supplied from grooves formed in the pressure chamber side of the graphite plate 26, for example, from grooves 32 and 33 supplying black ink, grooves 34 and 35 supplying magenta ink, grooves 36 and 37 supplying yellow ink, and grooves 38 and 39 supplying cyan ink. The appropriate color ink is supplied to these grooves through corresponding apertures 40 and 41, 42 and 43, 44 and 45 and 46 and 47, which extend through the carbon plate 26 to corresponding sets of grooves 50 and 51, 52 and 53, 54 and 55 and 56 and 57, formed in the opposite side of the plate. Those grooves, shown in solid lines in FIG. 3 and in dotted lines in FIG. 2, communicate with further apertures 60 corresponding to the passages 19 and 25 of FIG. 1, which extend through the plate to convey ink from the deaerator ink path 16 of FIG. 1 to the pressure chamber supply grooves 32–39. As shown in FIG. 3, the flow-through passages 24 convey ink between the orifice passages 21 and the groove patterns 50–57 on the opposite side of the carbon plate to complete the continuous path for circulation of ink through the deaerator 15.

In addition, the carbon plate 26 is especially advantageous for ink jet heads used with hot melt ink. Because of its high thermal conductivity, the carbon plate provides excellent heat conduction from heaters mounted at relatively remote locations in the head to all of the ink passages in the head. This assures that the hot melt ink at each of the orifices 12 is at the same temperature and therefore has the same viscosity, thereby providing good uniformity of operation throughout the length of the array of orifices.

A typical carbon plate 26 may be about 2 mm thick and have orifice passages 21 about 0.2 mm in diameter, pressure chambers about 9 mm long, 0.5 mm wide and 0.2 mm deep, supply grooves about 1.0 to 1.5 mm wide and 0.5 mm deep, flow-through passages about 4 mm long, 0.1 mm wide and 0.05 mm deep, and apertures 60 about 1.5 mm in diameter. With this arrangement, a 96-aperture linear array of the type shown in the drawings can be provided in a carbon plate 26 having dimensions of about 4 cm by 7 cm with the orifice passages 21 spaced by about 0.5 mm. When oriented at an appropriate angle with respect to the scanning direction, an ink jet head using an array of this type can produce a resolution of about 300 dots per inch (120 dots per cm) in the subscanning direction and, when actuated at a rate of about 14 Khz at a scanning rate of 1 m/sec to produce 100 picoliter drops, can produce the same resolution in the scanning direction.

In certain high-frequency ink jet applications, the rigidity of the walls of the pressure chambers 20 formed in the carbon plate may be less than desired, requiring a higher operating voltage for the piezoelectric actuating plate. To alleviate this, the surfaces of the pressure chambers 20 formed in the carbon plate may be coated with a thin layer, such as 0.01 to 0.1 mm thick, of a very hard (i.e., high modulus of rigidity) material such as a carbide or nitride, e.g., silicon carbide or nitride, boron carbide or nitride, tungsten carbide or nitride, tantalum carbide or nitride, or the like. Preferably, the coating is applied by chemical vapor deposition.

Figure 4:
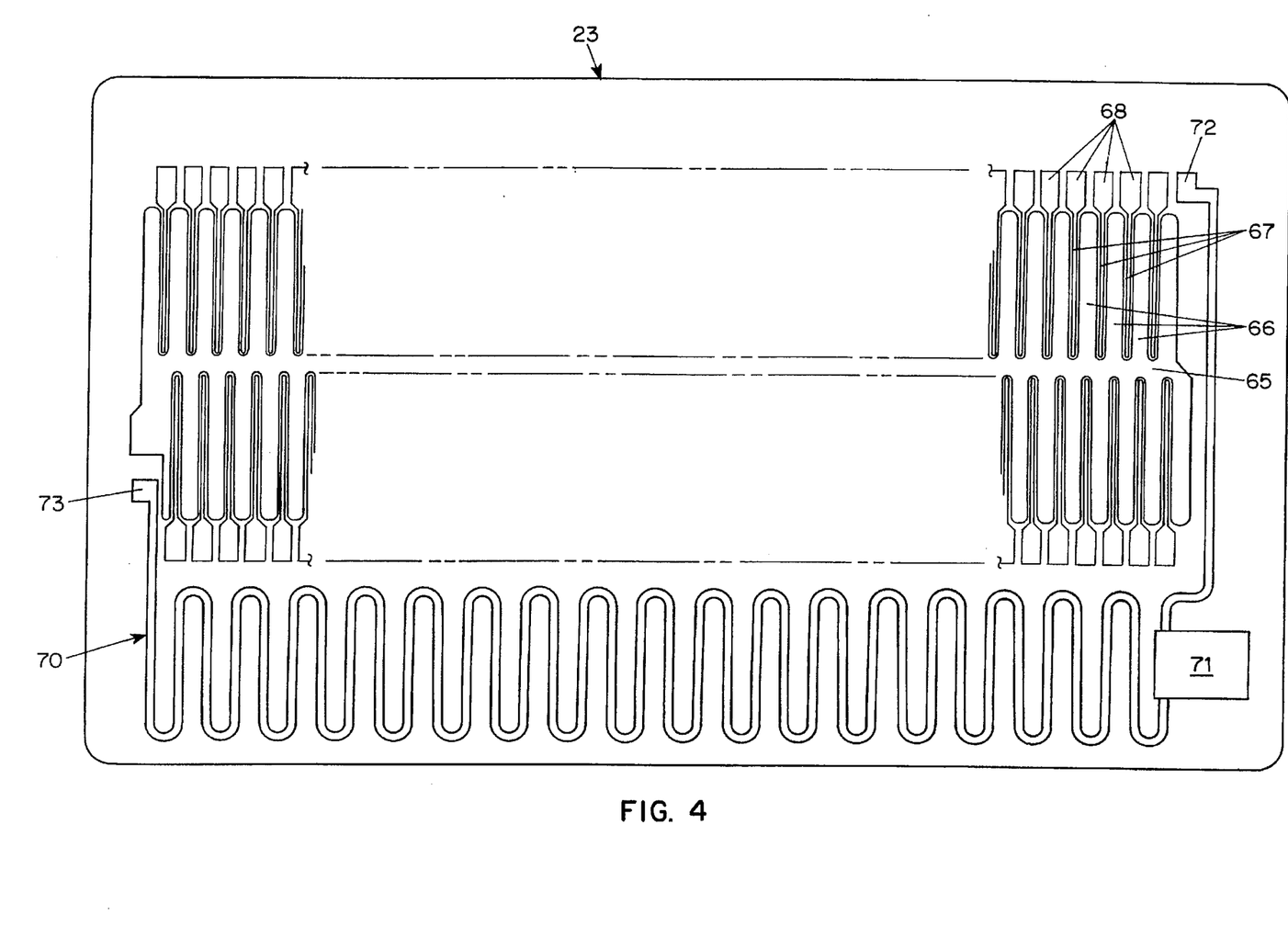
FIG. 4 is a schematic view illustrating a typical arrangement of electrodes on the exposed surface of a piezoelectric plate used with the carbon plate shown in FIGS. 2 and 3.

In order to actuate the piezoelectric plate 23 so as to selectively eject ink from the pressure chambers 20 through the orifice passages 21 and through corresponding orifices 12 in the orifice plate 13, the piezoelectric plate 23, which is mounted on the pressure chamber side of the carbon plate, has no electrodes on the carbon plate side and is patterned with an electrode array of the type shown in FIG. 4 on the exposed side. In the array shown in FIG. 4, a common electrode 65 extends along the portion covering the orifice passage array in the carbon plate and also extends laterally into regions 66 over the carbon plate surface portions between the pressure chambers.

Interlaced between the lateral extensions 66 is a spaced array of individual electrodes 67 which are positioned directly over the pressure chambers in the carbon plate so that, when selectively actuated by application of appropriate potential to a corresponding terminal 68, the piezoelectric plate 23 is mechanically distorted in the shear mode in the direction toward the adjacent pressure chamber 20 so as to cause ejection of an ink drop from the orifice with which that pressure chamber communicates. Shear-mode operation of a piezoelectric plate is described, for example, in the Fischbeck et al. U.S. Pat. No. 4,584,590, the disclosure of which is incorporated herein by reference. Such shear-mode operation does not require any electrode on the opposite side of the piezoelectric plate but, if desired, the carbon plate 26, being conductive, can be used to provide an electrode on the opposite side of the plate.

The electrode pattern shown in FIG. 4 also includes a heater conductor 70 having a thermistor temperature control switch 71 extending between two terminals 72 and 73 and arranged to heat the ink in the passages in the lower portion of the carbon plate 26 so as to cause circulation of the ink in the manner described above by thermal convection. Because the carbon material in the plate 26 has a high thermal conductivity, the plate acts as a thermal conductor between the heater and the adjacent ink passages in the plate.

In order to form an electrode pattern of the type shown in FIG. 4 on the piezoelectric plate 23, the plate, which is initially provided with a continuous conductive coating on the exposed side, is permanently affixed by an epoxy adhesive to the pressure chamber side of the carbon plate 26. Since the carbon plate is slightly porous, an epoxy adhesive can be used to mount not only the piezoelectric plate 23, but also the orifice plate 13, to the opposite surfaces of the carbon body. For this purpose, one of the surfaces of the plates to be joined is preferably spray-coated with a layer of B-stage epoxy adhesive about 2 microns thick before the piezoelectric plate 23 or the orifice plate is applied to it. Such a thin layer of epoxy adhesive provides excellent seals between the plates, including the very narrow portions between the orifice passages, but does not flow into the passages or apertures in such a way as to interfere with the operation of the head.

In order to ground the surface of a the piezoelectric plate which is bonded to the carbon body, the epoxy adhesive may be doped with conductive particles. Alternatively, the clamping force applied during bonding of the piezoelectric plate to the carbon body is increased until the epoxy adhesive is driven into the carbon body to provide a large number of point contacts between the plate and the carbon body.

Figure 11:
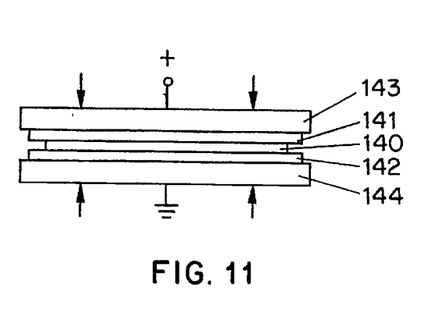
FIG. 11 is a schematic view illustrating one representative method for poling a piezoelectric plate.

The use of single sided piezoelectric plates requires special techniques for poling the plates. According to one technique, schematically shown in FIG. 11, a piezoelectric plate 140 is compressed between two electrodes 141 and 142 separated from the plate 140 by two slightly conductive rubber sheets 143 and 144 to provide intimate electrical contact throughout the surfaces of the plate while limiting the current available for arcing if a breakdown occurs. When this procedure is carried out in two steps to minimize piezo stresses, high yield poling of unmetalized piezoelectric plates is achieved.

Figure 12:
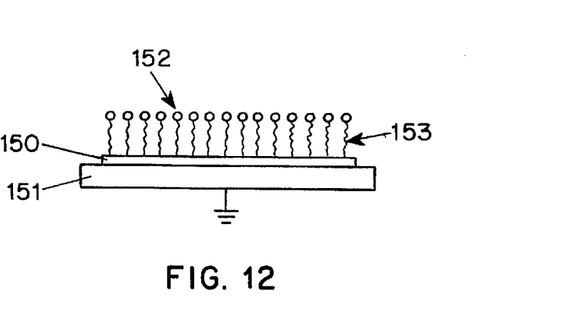
FIG. 12 is a schematic view illustrating another representative method for poling a piezoelectric plate.

The other poling technique, shown in FIG. 12, uses a corona discharge to set up a poling field across the piezoelectric plate. A piezoelectric plate 150 is laid on a flat ground plate 151, and a corona discharge device 152 rains charges 153 down onto the surface. When the applied charge is sufficient to create an occasional breakdown through the plate, which is non-destructive because of the high surface resistance of the piezoelectric material, the plate is poled. This process is preferably carried out at an elevated temperature, such as 100°–150° C., to ameliorate poling stresses.

The orifices 12 in the orifice plate 13 of FIG. 1, which may be a stainless steel plate about 0.05 mm thick, are preferably about 0.05 mm in diameter and are formed by electrical discharge machining. By selecting the appropriate size wire and controlling the current/voltage profile, the size and shape of the orifice can be controlled accurately. Bonding of the orifice plate to the surface of the carbon body is accomplished in the same way as the bonding of the piezoelectric plate.

With conventional bell-mouthed shaped orifices in an orifice plate of the type shown, for example, in the Hoisington et al. U.S. Pat. No. 5,265,315 in which the orifice diameter decreases at a continuously decreasing rate from a large diameter on the side of the orifice plate facing the ink jet head to a smaller diameter about one-third that of the large diameter on the side of the orifice plate through which the ink drop was ejected, the direction of ink drop ejection is very sensitive to asymmetries in the ink path near the periphery of the entrance to the bell-mouthed orifice. Moreover, it is not possible to space such bell-mouthed orifices as closely as desired for high resolution printing.

Figure 13:
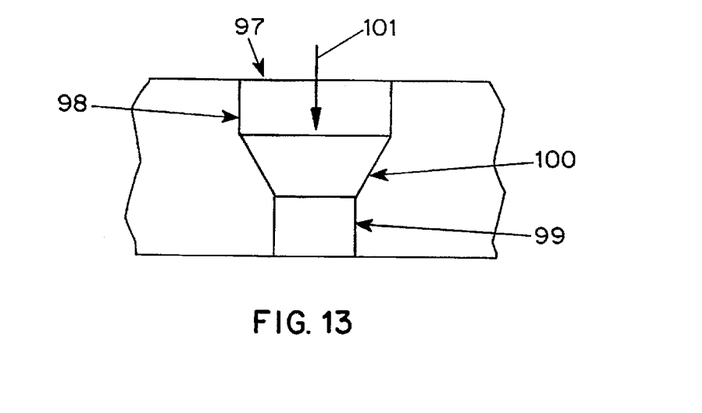
FIG. 13 is a fragmentary view in longitudinal section showing the shape of an orifice in an orifice plate in accordance with the invention.

To overcome this problem, electrical discharge machining is used to form orifices 97 having the shape shown in FIG. 13 with a cylindrical inlet section 98, a smaller diameter cylindrical nozzle section 99 providing the outlet from the orifice plate and a tapered section 100 having a conical surface joining the inlet section and the nozzle section. It has been found that with an orifice design of this type, the non-axial velocity component of an ejected drop, i.e. the extent of deviation from the axial arrow 101 resulting from asymmetry of the passage leading to the orifice is reduced by more than 50%.

In a typical orifice plate 13 having a thickness of 0.05 mm, a nozzle 99 having a diameter of 0.054 mm and a length of 0.01 mm, a tapered section 100 having a cone angle of 30° and a length of 0.01 mm and an inlet section 98 having a diameter of 0.11 mm and a length of 0.03 mm, a substantial improvement in axial projection of drops supplied from an asymmetric ink path leading to the orifice was obtained. For an orifice plate 13 having a thickness of 0.075 mm and having the same nozzle and tapered section dimensions described above, and having an inlet section 0.055 mm long, a similar improvement in the direction of projection of drops was obtained at a slightly increased pressure drop. Preferably, the diameter of the inlet portion 98 of the orifice is no more than twice the diameter of the nozzle portion 99 and the length of the inlet portion 98 is greater than that of the nozzle portion. Such orifice shapes having successive conical and tapered cylindrical sections can be obtained by appropriate conventional electrical discharge machining techniques.

In accordance with one aspect of the invention, after the piezoelectric plate 23 has been affixed to the carbon plate, a layer of photoresist material is coated on the exposed surface and, using the precisely known positions of the pressure chambers from a reference edge in the carbon body, the photoresist is exposed to produce a pattern which corresponds exactly with the locations of the pressure chambers, and the unexposed resist is removed in the usual manner. Thereafter, the conductive layer is etched away from the exposed surface of the piezoelectric plate and the remaining resist is then removed to provide the final electrode pattern.

In this way, the piezoelectric plate 23, which is preferably only about 0.1 to 0.25 mm thick and is quite fragile, is protected from damage during the formation of the electrode pattern and other head-manufacturing steps. Consequently, substantially large piezoelectric plates, for example, 50 mm by 100 mm or more, can be used without substantial risk of damage during processing. Moreover, large-scale production is facilitated since a large-size carbon plate can be machined with multiple identical or similar patterns, and a corresponding number of piezoelectric plates can be bonded to the pattern locations on the large sheet and simultaneously exposed and etched to form electrode patterns corresponding precisely to the structures of the adjacent portions of the carbon plate, after which the large-size plate is separated into individual plates.

Figure 5:
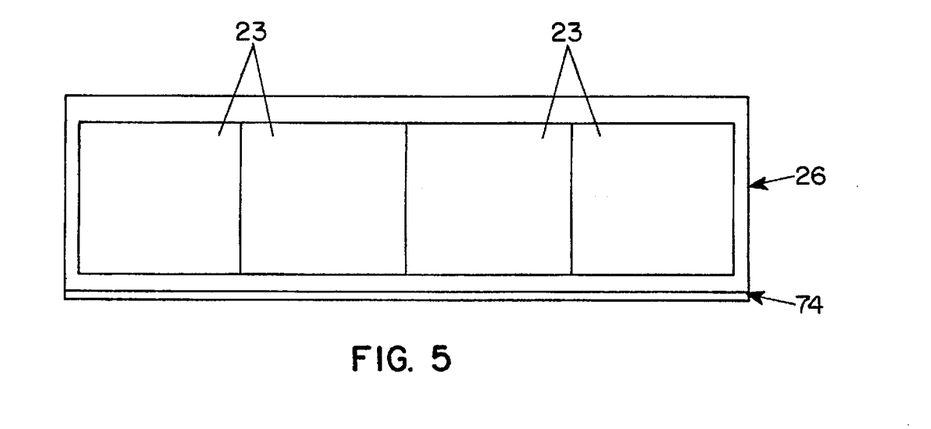
FIG. 5 is a schematic plan view of a typical large-size carbon plate having a series of piezoelectric plates mounted on one surface in accordance with another embodiment of the invention.

Furthermore, instead of separating a large-size carbon plate into smaller plates, a single carbon plate 20 cm wide, or even 150 cm wide, if appropriate, may be made to provide a page-width ink jet head by mounting a row of piezoelectric plates to one surface and simultaneously processing the piezoelectric plates in the manner described above. A typical page-width ink jet head is shown in FIG. 5, in which a carbon plate 26 has a row of adjacent piezoelectric plates 23 affixed to one side. The ink jet head of FIG. 5 has internal passages arranged to supply ink to an orifice plate 74 mounted on one edge, as described hereinafter with respect to FIG. 8. Alternatively, if desired, the large-size plate 26 of FIG. 5 may have internal passages of the type described above with respect to FIG. 1 leading to an orifice plate (not shown in FIG. 5) mounted on the opposite side of the carbon plate.

Figure 6:
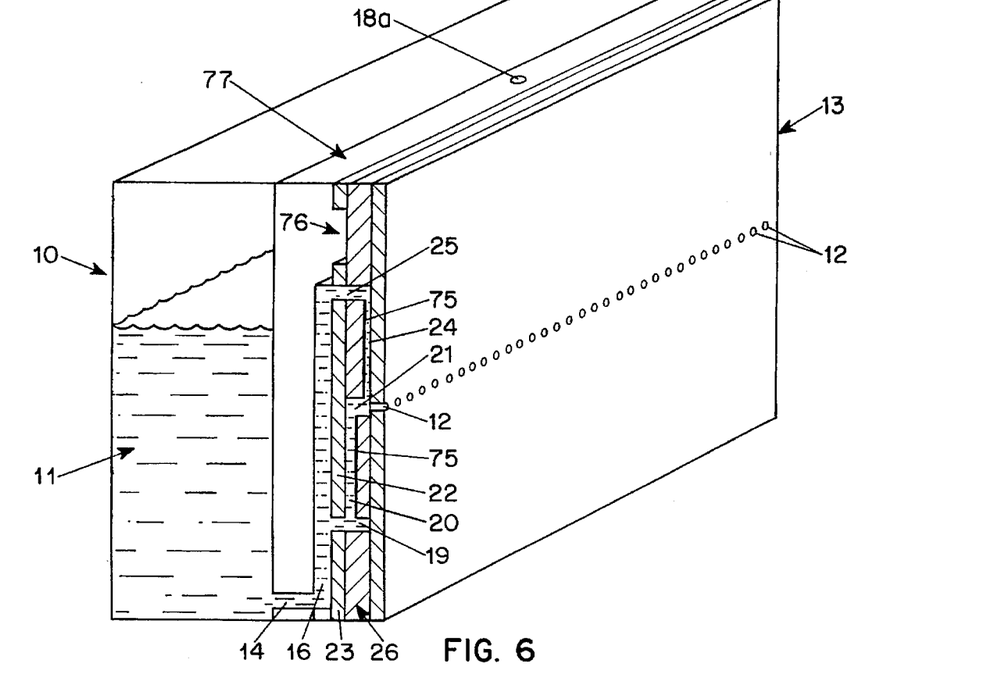
FIG. 6 is a schematic perspective view illustrating another representative embodiment of the invention.

As an alternative to the deaerator arrangement 15 shown in FIG. 1, the use of a carbon plate 26 which is slightly porous permits the plate to act as a conduit between the vacuum plenum and the ink in the passages within the carbon plate in the manner shown in the alternative embodiment of FIG. 6 so that dissolved air can be extracted. For this purpose, the surfaces of the plate passages are coated with a layer 75 of an air-permeable, ink-impermeable epoxy resin and one or more openings 76 are provided in the piezoelectric plate 23 to expose the adjacent surface of the carbon plate 26 to a vacuum source 77 which replaces the deaerator 15, the other exposed surfaces of the carbon plate 26 being sealed to prevent entry of air into the porous plate. The vacuum source 77 may be connected to a remote vacuum supply through the port 18a, or it may be a replaceable vacuum reservoir of the type described in the copending Hine Application Ser. No. 08/143,165, filed Oct. 26, 1993, the disclosure of which is incorporated herein by reference.

Figure 7:
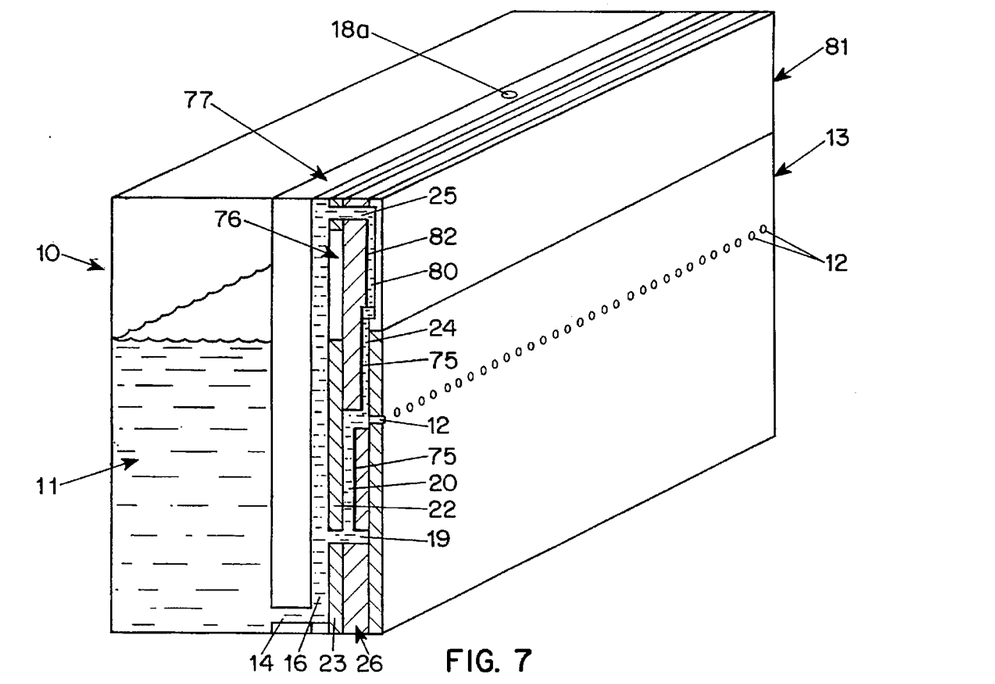
FIG. 7 is a schematic perspective sectional view similar to FIG. 6, illustrating another typical embodiment of the invention.

In another modified deaerator arrangement shown in FIG. 7, ink passages 80 extending between the passages 24 and 25 are formed in a plate 81 which is mounted on the front surface of the carbon plate 26 and an air-permeable, ink-impermeable membrane 82, similar to the membranes 17 of FIG. 1, is positioned between the carbon plate 26 and the plate 81. In this case, the coating 75 applied to the various passages within the carbon plate 26 is impermeable to air and only the portion of the plate 26 adjacent to the membrane 82 is used to extract air from the ink in the passages 80. If desired, a filter may also be incorporated in the plate 81 in the path of the ink between the passages 24 and 25. Otherwise, the arrangement of FIG. 7 is the same as that shown in FIG. 6.

Because the high thermal conductivity of the carbon plate 26 assures heat conduction from relatively remote heaters through the carbon plate to hot melt ink adjacent to an orifice plate, a hot melt ink jet head according to the invention may be arranged so that the ink is ejected from an orifice plate mounted on an edge of a carbon plate rather than from an orifice plate mounted on one side of the carbon plate. Moreover, even if the ink used in the ink jet head is not hot melt ink, the easy machinability of the carbon plate provides a distinct advantage in an arrangement of this type in contrast to a conventional laminated plate arrangement, in which edges of the plates adjacent to the orifice plate cannot be perfectly aligned, leading to irregularities in the mounting of the orifice plate.

Figure 8:
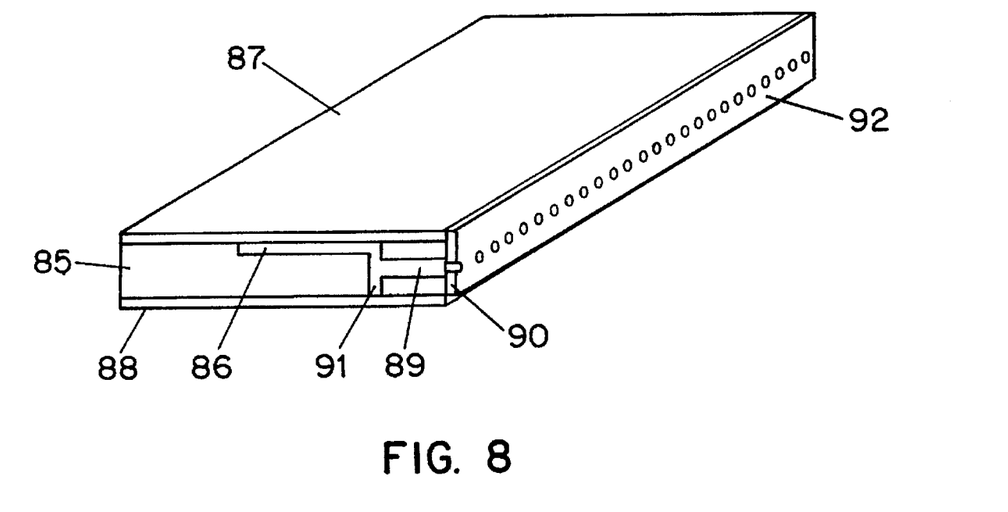
FIG. 8 is a schematic perspective view illustrating a further representative embodiment of the invention.

This arrangement is shown in FIG. 8, in which a carbon plate 85 has pressure chambers 86 formed in one side and a piezoelectric plate 87 affixed to that side of the plate, and a bottom cover plate 88 affixed to the opposite side of the plate. A row of orifice passages 89, which are drilled into one edge 90 of the carbon plate 85, communicate with the pressure chambers 86 through perpendicular passages 91 extending through the plate 85. With a carbon plate 85 of this type, the end surface 90 can be ground perfectly flat and the plate can then be drilled to form the passages 89 and 91 to connect with the pressure chambers 88, after which an orifice plate 92 is affixed to the edge 90 by epoxy adhesive in the manner described above.

An ink jet head made in this way is especially advantageous, not only because it requires only a very narrow strip for the orifice plate 92, but also because it permits the bulk of the printhead to be spaced from the paper path and also permits stacking of multiple printheads.

Figure 9:
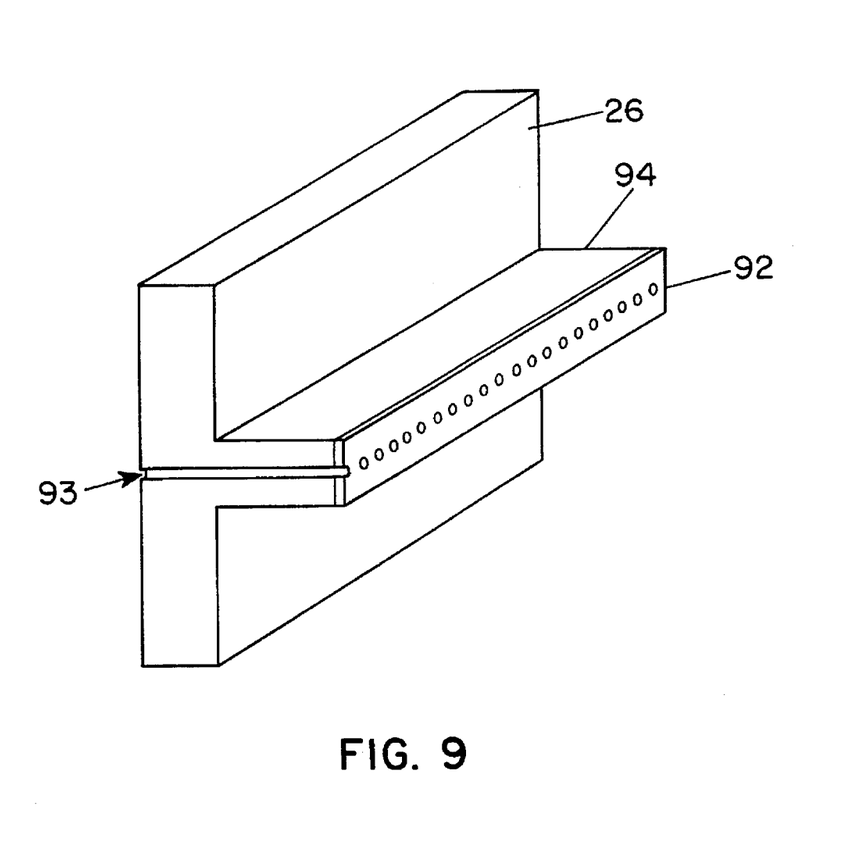
FIG. 9 is a fragmentary perspective view illustrating a modified form of the invention.

If desired, the ink jet head of FIG. 1 can be modified to provide similar advantages by forming the carbon plate 26 with a projecting portion 94 through which orifice passages 93 extend to an orifice plate 92, as illustrated in FIG. 9.

In a further embodiment of the invention shown in FIGS. 14–20, an ink jet head is assembled from a plurality of carbon components. In this embodiment, as illustrated in the exploded view of FIG. 14, two carbon pressure plate assemblies 102, described in greater detail hereinafter, are assembled in a carbon collar 103 so that their end surfaces, which contain ink outlet passages, are aligned with corresponding openings in a manifold plate 104 to which the pressure chamber plate assemblies 102 are affixed by screws 105 extending through the manifold plate and into an adjacent pressure chamber plate 106. An orifice plate 107 has a linear array of closely spaced orifices 108 which are aligned with the ends of arrays of passages 109 (FIG. 20) in the manifold plate 104 so as to eject ink in response to selective actuation of the pressure plate assemblies.

Figure 14:
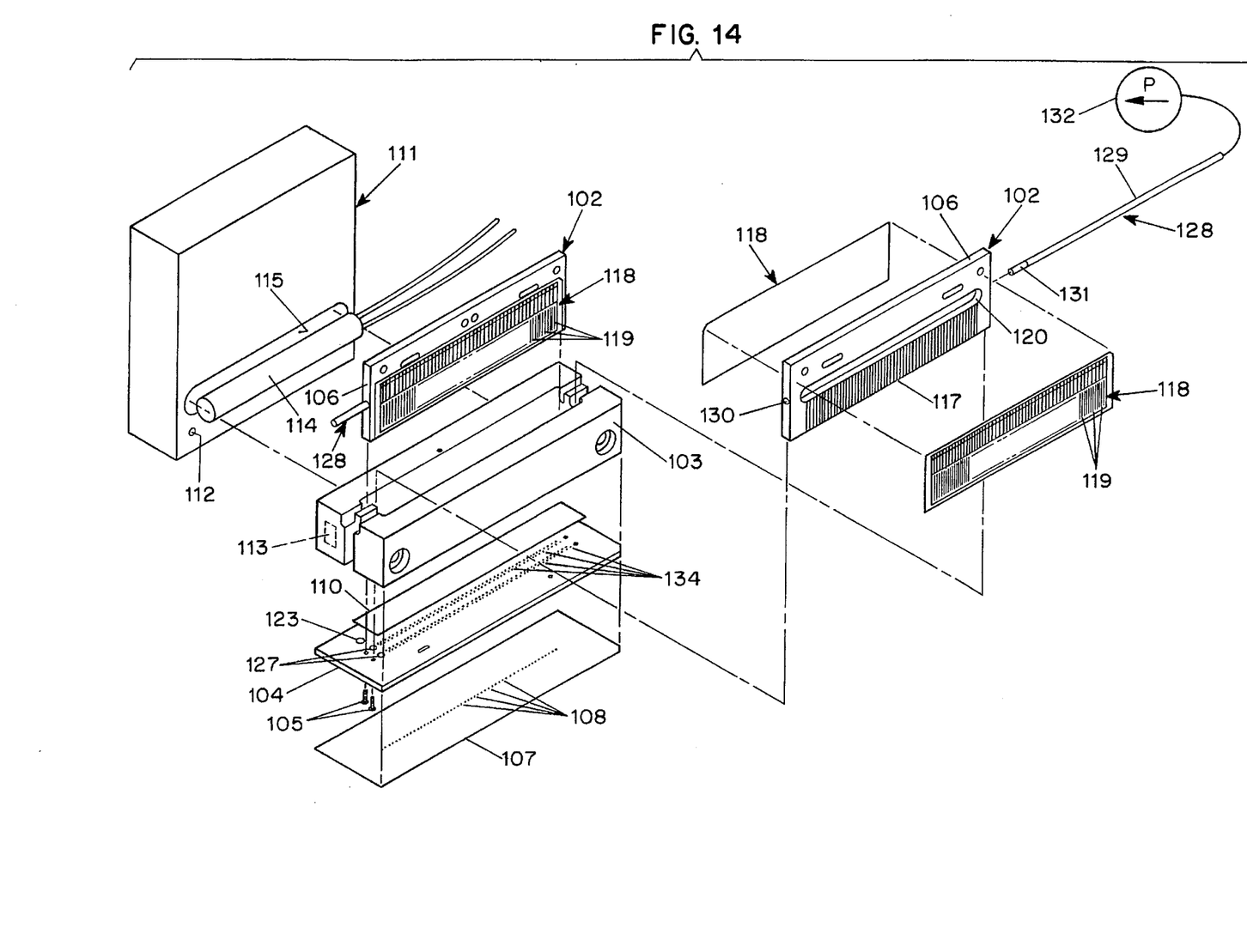
FIG. 14 is an exploded perspective view illustrating another representative embodiment of a simplified ink jet head arrangement in accordance with the invention.

Interposed between the ends of the pressure plate assemblies 102 and the manifold plate 104 is a filter layer 110 having pores or openings slightly smaller than the orifices 108 in the orifice plate 107 so as to prevent potentially orifice-clogging solid material from reaching the orifices 108 but large enough to permit particles of solid material smaller than the size of the orifices to pass through the filter layer. This type of filter is described, for example, in the copending Moynihan et al. application for "Filter Arrangement For Ink Jet Head" Ser. No. 08/231,102, filed Apr. 22, 1994.

Figure 16:
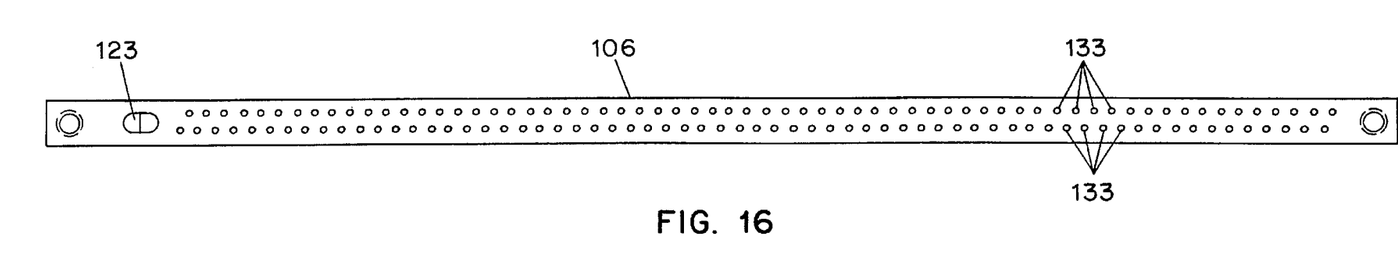
FIG. 16 is an end view of the representative carbon pressure chamber plate shown in FIG. 15.
Figure 18:
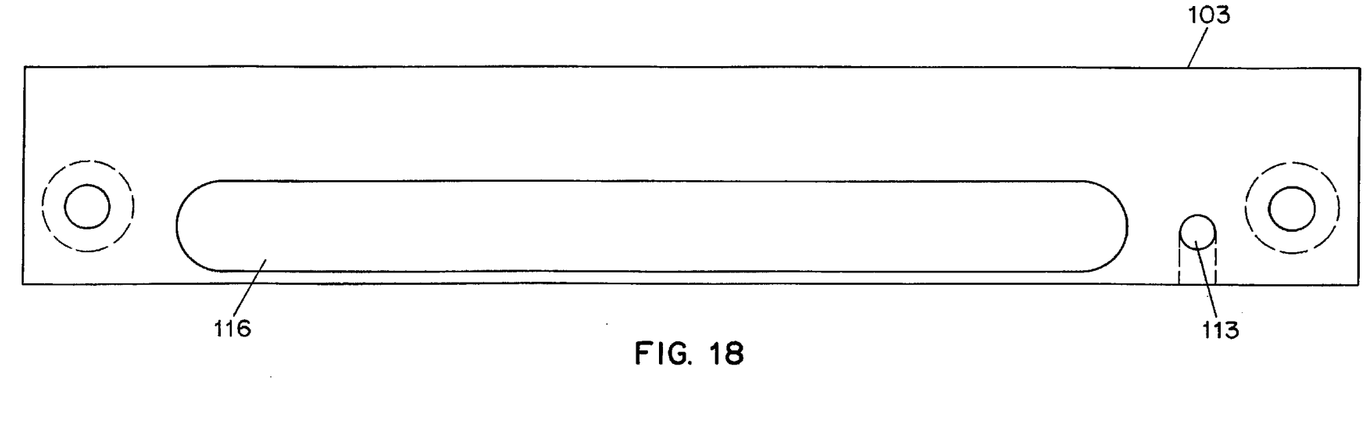
FIG. 18 is a side view of the collar block shown in FIG. 17.

An ink reservoir 111, mounted against one side of the collar 103 has an ink supply opening 112 which supplies ink to the collar 103. As best seen in FIG. 16, a corresponding opening 113 in the collar is aligned with the opening 112 to receive ink from the reservoir 111. In addition, if hot melt ink is to be used in the ink jet head, a cartridge heater 114 is mounted in a groove 115 formed in the side of the reservoir and in a corresponding groove 116 (FIG. 18) in the side of the collar 103 and is controlled so as to maintain the ink within the assembled ink jet head at a desired temperature during operation of the system.

Each pressure chamber assembly 102 includes a pressure plate 106 having arrays 117 of closely spaced pressure chambers formed on opposite sides of the plate 106 and each of those arrays is covered by a piezoelectric plate 118 of the type described previously with respect to FIG. 4, having an array of electrodes 119 arranged with respect to the array of pressure chambers 117 to change the volume of the corresponding pressure chamber in response to appropriate electrical signals.

Figure 15:
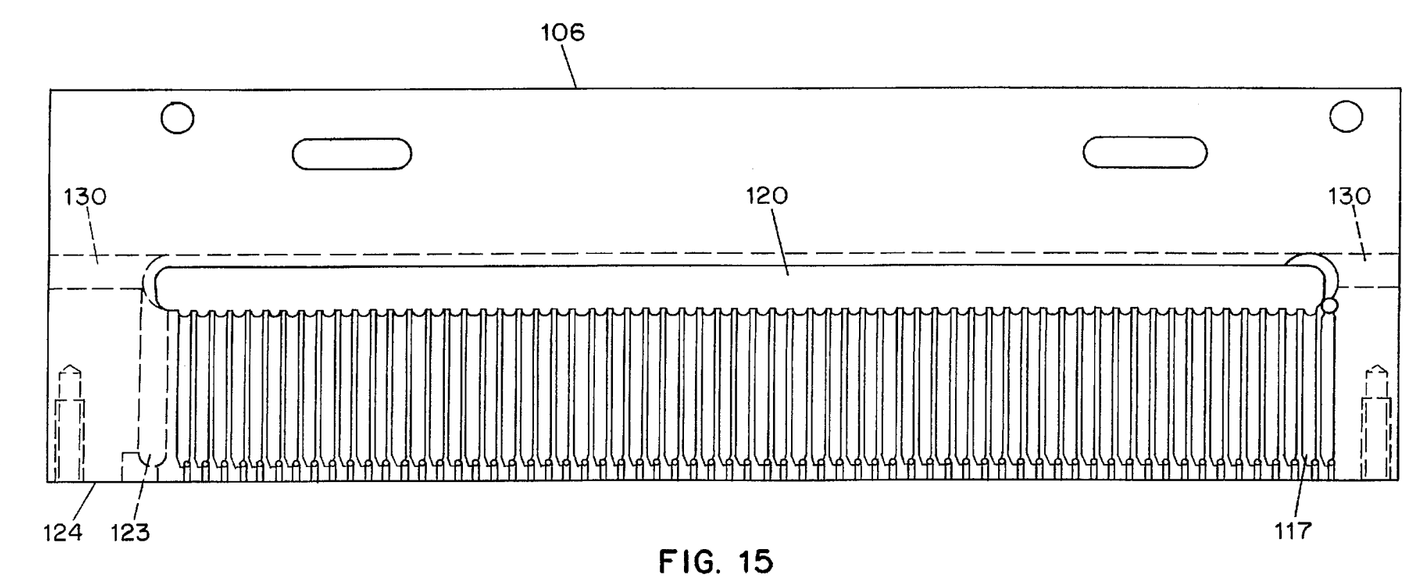
FIG. 15 is a side view illustrating a representative carbon pressure chamber plate of the type used in the arrangement shown in FIG. 14.
Figure 19:
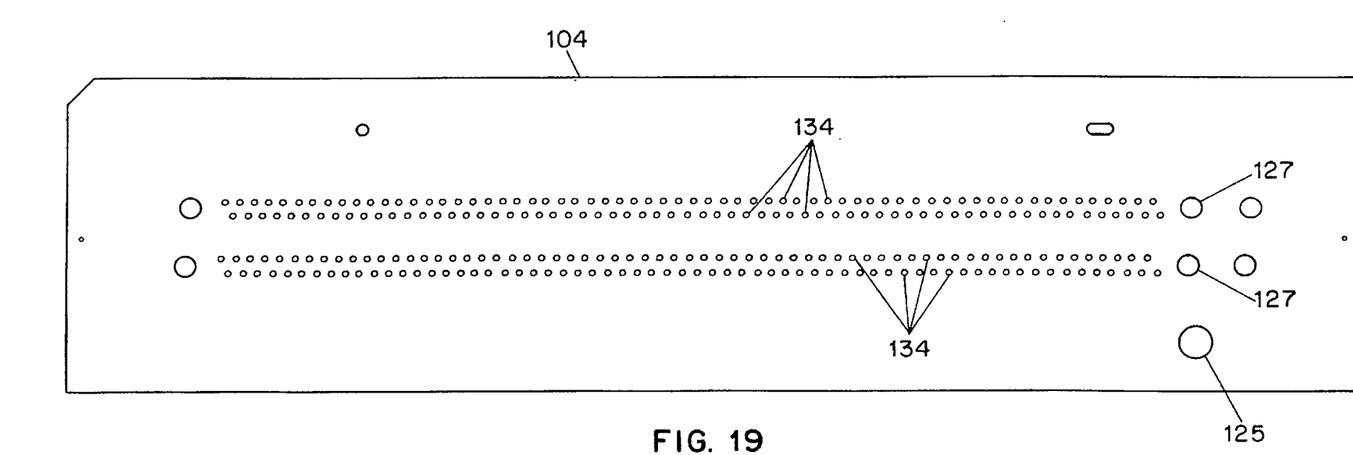
FIG. 19 is a plan view showing one side of a representative carbon manifold plate of the type used in the arrangement shown in FIG. 14.

The pressure chamber plate 106, which is illustrated in greater detail in FIGS. 15 and 16, has a longitudinally extending opening 120 which, in the illustrated embodiment receives ink through an internal passage 123 terminating at an end surface 124 which faces the manifold plate 104 as seen in FIG. 14. As shown in FIG. 19, the surface of the manifold plate 104 facing the pressure chamber plate, has an opening 125 which receives ink from the collar passage 113 and supplies it to a groove 126 (FIG. 20) on the opposite side of the manifold plate, from which ink passes through two further openings 127 in the manifold plate to the passages 123 in the pressure plates 106 so that the ink is distributed through the longitudinal opening 120 to all of the pressure chambers in both of the arrays 117 in each plate.

In order to extract dissolved air from the ink as it is being supplied to the arrays 117 of pressure chambers, a deareator 128 consisting of a tubular member 129 made of air-permeable, ink-impermeable material, such as extruded polytetrafluoraethylene having a 0.1 mm wall thickness and a 1.5 mm internal diameter, extends through an opening 130 in the edge of each pressure chamber plate 106 and into the longitudinal opening 120. A plug 131 closes the inner end of the tube and the end projecting out of the opening 130 in the plate 106 is connected to a vacuum source 132 supplying sufficient negative pressure, such as 0.7 atmosphere, to reduce the dissolved air content of the ink being supplied to the pressure chambers below the level at which air bubbles can form in the pressure chamber during operation of the ink jet system. In order to prevent the tube 129 from collapsing in response to application of negative pressure, a porous support, such as a rod of porous carbon or a helical wire having a diameter substantially equal to the internal diameter of the tube, is inserted into the tube.

As shown in FIG. 16, the end surface 124 of the carbon plate 106 has two arrays of ink passages 133 which extend perpendicularly to the end surface 123 and each of those passages communicates internally with the adjacent end of a corresponding pressure chamber in the arrays 117. Consequently, upon actuation of one of the pressure chamber, ink is forced out of the plate 106 through a corresponding one of the passages 133.

Figure 17:
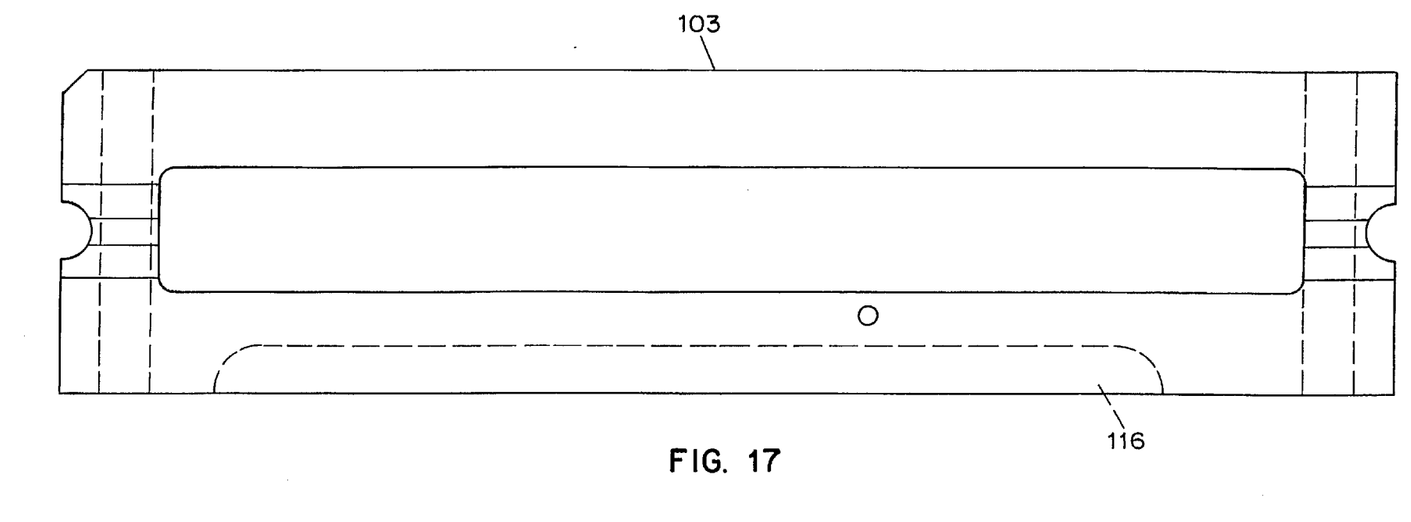
FIG. 17 is a top view of the carbon collar block used in the arrangement shown in FIG. 14.
Figure 20:
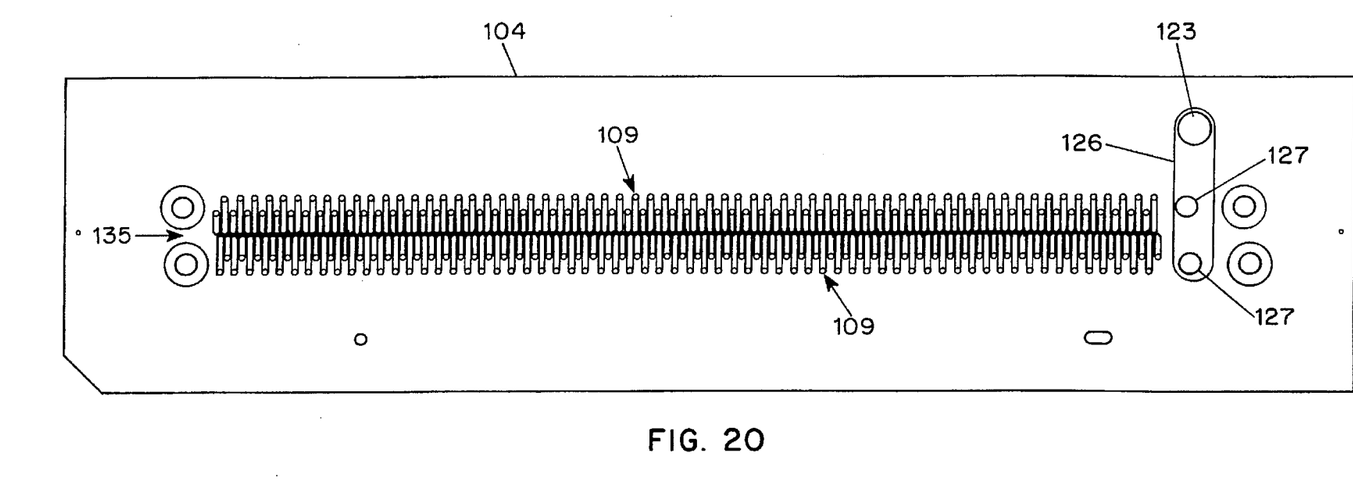
FIG. 20 is a plan view showing the opposite side of the manifold plate of FIG. 19.

After passing through the filter layer 110, ink from each of the passages 133 is supplied through a corresponding passage 134 in an adjacent surface of the manifold plate 104 shown in FIG. 17 and, as shown in FIG. 20, the arrays of passages 109 in the opposite surface of the manifold plate extend horizontally along the surface of that plate to convey the ink supplied through the passages 134 in a lateral direction toward the center of the manifold plate. Those passages terminate in a central line 135 extending longitudinally along the manifold plate so as to be in line with the line of ink jet orifices 108 in the orifice plate 107.

Although carbon is the preferred material for the manifold plate 104, especially for ink jet heads used with hot melt ink, other materials which can be formed with a sufficiently flat surface and which have a thermal expansion coefficient compatible with adjacent components may also be used. For example, steel and ceramics such as alumina and glass, in which appropriate passages can be formed by photo-etching, may also be used to form the manifold plate.

In a typical embodiment of the type shown in FIGS. 14–20, each pressure chamber plate 106 is approximately 75 mm long, 22 mm wide and 2.5 mm thick and each pressure chamber array 117 contains 64 pressure chamber approximately 9 mm long, 1 mm wide and 0.15 mm deep and the manifold plate 104 is approximately 1.4 mm thick.

Heretofore it was believed that the total length of the descender, which is the ink path leading from the end of the pressure chamber to the orifice in the orifice plate, should be as short as possible, i.e. no more than about 1 mm. Although it is clear that each descender should have a constant cross-section similar to that of the pumping chamber so that its acoustic properties do not result in undesirable reflections, and that it should be short enough that viscus flow losses are not excessive and that it should also be fluidically stiff so that pressure energy losses from the surrounding structure are not excessive, it has now been determined that, in ink jet heads made of carbon components, the descender need not be so limited in length and can consist of a plurality of passages such as those in the manifold plate and within the pressure chamber plate which total as much as 7 mm in length without loss of performance. This permits greater flexibility in the design of ink jet heads in several respects. For example, the piezoelectric plate, which is quite fragile, can be spaced a significantly greater distance away from the substrate being printed by the head and the body of the ink jet array may be made thick enough to be mechanically robust and to provide good thermal uniformity. Moreover, laterally spaced pressure chambers such as those in the arrays 117 may be connected through laterally spaced passages 133 to supply ink to a single line of orifices 108 by using an arrangement of laterally directed passages 109 such as that incorporated into the manifold plate 104.

With the simplified ink jet head according to the invention, the problems caused by burrs and dimensional variations resulting from heat produced in machining, by differences in temperature coefficient of expansion of the materials used in the ink jet head, and by the necessity for assembling a number of previously formed plates in precise relation, and the problems of bond stresses during temperature cycling are effectively eliminated in a convenient and inexpensive manner. Moreover, the number of steps required for the formation of the electrode pattern on the piezoelectric plate and application of the plate to the ink jet head is substantially reduced and variations in electrode positioning with respect to the pressure chamber positions are eliminated.

Although the invention has been described herein with reference to specific embodiments, many modifications and variations therein will readily occur to those skilled in the art. Accordingly, all such variations and modifications are included within the intended scope of the invention.

We claim:

1. An orifice plate for an ink jet head comprising a metal plate having parallel inner and outer planar surfaces and an array of orifices extending between the inner and outer surfaces wherein each of the orifices has a cylindrical ink outlet portion having a diameter and extending inwardly from the outer surface of the plate, a cylindrical ink inlet portion extending inwardly from the inner surface of the plate having a larger diameter than the diameter of the ink outlet portion, and a tapered conical portion joining the ink inlet portion and the ink outlet portion and having a surface formed in the shape of a cone generated by the hypotenuse of a right triangle rotated about one of its legs as an axis and wherein the ink inlet portion has a length greater than the length of the ink outlet portion, whereby improved axial projection of ink drops is obtained with ink supplied from an asymmetric ink path leading to the orifice.

2. An orifice plate according to claim 1 wherein the diameter of the ink inlet portion is no more than about twice the diameter of the ink outlet portion.

* * * * *